(12) United States Patent
Parent et al.

(10) Patent No.: US 9,297,064 B2
(45) Date of Patent: Mar. 29, 2016

(54) IN-LINE METALLIZER ASSEMBLIES AND PART-COATING CONVEYOR SYSTEMS INCORPORATING THE SAME

(75) Inventors: Donald G. Parent, Windham, ME (US); Joseph W. Gresik, Windham, ME (US); Eric J. Brown, Old Orchard Beach, ME (US); Jeffrey J. Black, Biddeford, ME (US)

(73) Assignee: Marca Machinery, LLC, Gorham, ME (US)

( * ) Notice: Subject to any disclaimer, the term of this patent is extended or adjusted under 35 U.S.C. 154(b) by 719 days.

(21) Appl. No.: 12/688,482

(22) Filed: Jan. 15, 2010

(65) Prior Publication Data

US 2010/0181193 A1 Jul. 22, 2010

Related U.S. Application Data

(60) Provisional application No. 61/205,200, filed on Jan. 16, 2009.

(51) Int. Cl.
| | |
|---|---|
| *C23C 14/34* | (2006.01) |
| *C23C 14/56* | (2006.01) |
| *C23C 14/18* | (2006.01) |
| *C23C 14/20* | (2006.01) |
| *C23C 28/00* | (2006.01) |
| *C23C 28/02* | (2006.01) |

(52) U.S. Cl.
CPC .............. *C23C 14/56* (2013.01); *C23C 14/185* (2013.01); *C23C 14/205* (2013.01); *C23C 28/00* (2013.01); *C23C 28/02* (2013.01)

(58) Field of Classification Search
CPC .... C23C 14/56; C23C 14/185; C23C 14/205; C23C 28/00; C23C 28/02

USPC .......... 204/298.01, 298.25, 298.28; 264/447, 264/643, 129, 132, 25
See application file for complete search history.

(56) References Cited

U.S. PATENT DOCUMENTS

| 4,274,936 | A | * | 6/1981 | Love .................... 204/192.13 |
| 4,825,808 | A | * | 5/1989 | Takahashi et al. ........... 118/719 |
| 5,110,249 | A | * | 5/1992 | Norman ..................... 414/217 |
| 5,412,863 | A | * | 5/1995 | Prodel ........................ 29/799 |
| 5,709,785 | A | * | 1/1998 | LeBlanc et al. .......... 204/298.25 |

(Continued)

FOREIGN PATENT DOCUMENTS

| EP | 1129232 B1 | 2/2013 |
| WO | WO0028105 A1 | 5/2000 |

OTHER PUBLICATIONS

International Search Report and Written Opinion in International Application No. PCT/US2013/065632 mailed on Jan. 7, 2014.

*Primary Examiner* — John Brayton
(74) *Attorney, Agent, or Firm* — Dinsmore & Shohl LLP

(57) ABSTRACT

In-line metallizer assemblies can include an external rotating actuator exchange that can be operable to exchange one or more parts between a conveyor system and a vacuum chamber, and an internal rotating actuator exchange within the vacuum chamber that can be operable to receive the one or more parts from the external rotating actuator exchange, transition the one or more parts to a sputter coater integrated with the vacuum chamber for metallizing, and return metallized one or more parts to the external rotating actuator exchange such that the external rotating actuator exchange can return the metallized one or more parts to the conveyor system.

14 Claims, 6 Drawing Sheets

(56) References Cited

U.S. PATENT DOCUMENTS

| | | |
|---|---|---|
| 6,196,154 B1 * | 3/2001 | Baumecker et al. .... 118/723 VE |
| 6,471,837 B1 * | 10/2002 | Hans et al. .............. 204/298.41 |
| 6,517,692 B1 | 2/2003 | Zeberinsh |
| 6,676,810 B2 | 1/2004 | Parent |
| 6,730,194 B2 * | 5/2004 | Schertler ................. 204/192.26 |
| 6,983,925 B2 | 1/2006 | Parent et al. |
| 2002/0144890 A1 | 10/2002 | Schertler |
| 2007/0035059 A1 * | 2/2007 | Ruuttu ......................... 264/132 |
| 2012/0234670 A1 | 9/2012 | Perego |

\* cited by examiner

IN-LINE METALLIZER ASSEMBLIES AND PART-COATING CONVEYOR SYSTEMS INCORPORATING THE SAME

CROSS-REFERENCE TO RELATED APPLICATIONS

This patent application claims priority to Provisional Patent Application No. 61/205,200 filed Jan. 16, 2009, which is hereby incorporated by reference in its entirety.

TECHNICAL FIELD

The present specification generally relates to metallizing parts and, more specifically, to assemblies for sputter coating plastic parts in-line with conveyor systems.

BACKGROUND

Plastic and glass parts are often painted and coated with different materials to change their visual appearance. For instance, plastic parts may first receive one or more basecoats of paint or primer. Basecoats can fill in defects left over from manufacturing and handling as well as provide a more durable and adhesive surface for subsequent coatings. A topcoat may also be applied to protect the basecoat or to otherwise alter the appearance of the part. Both basecoats and topcoats can be applied to parts as they travel about a conveyor line. It can also be desirable to produce a reflective or metallic appearance by applying a reflective metal coating. The metal coating can be applied between the basecoat and the topcoat, on top of a basecoat without a topcoat, below a topcoat without a basecoat, or in any other combination of basecoats and/or topcoats. For example, a thin layer of metal can be deposited onto the surface of the part using an evaporation process such as that available with a batch metallizer. However, batch metallizers and other conventional assemblies can require the collecting and racking of large quantities of parts which can, in turn, create high cycle times for the metallizing process.

Accordingly, a need exists for alternative metallizer assemblies and conveyor systems for metallizing parts.

SUMMARY

In one embodiment, an in-line metallizer assembly includes an external rotating actuator exchange operable to exchange one or more parts between a conveyor system and a vacuum chamber, and, an internal rotating actuator exchange within the vacuum chamber operable to receive the one or more parts from the external rotating actuator exchange, transition the one or more parts to a sputter coater integrated with the vacuum chamber for metallizing, and return metallized one or more parts to the external rotating actuator exchange such that the external rotating actuator exchange can return the metallized one or more parts to the conveyor.

In another embodiment, an in-line metallizer assembly includes an external rotating actuator exchange that includes one or more actuating arms connected to a rotating pivot, the one or more actuating arms can be operable to extend from and retract towards the rotating pivot, and the rotating pivot being can be operable to rotate the external rotating actuator exchange, an internal rotating actuator exchange that includes one or more internal actuating arms connected to an internal rotating pivot, the one or more internal actuating arms can be operable to extend from and retract towards the internal rotating pivot, and the internal rotating pivot can be operable to rotate the internal rotating actuator exchange, and a vacuum chamber that includes an integrated sputter coater and houses the internal rotating actuator exchange.

In yet another embodiment, a part-coating conveyor system includes one or more paint stations, an in-line metallizer assembly including an external rotating actuator exchange and an internal rotating actuator exchange, the internal rotating actuator exchange being housed within a vacuum chamber integrated with a sputter coater, wherein the in-line metallizer assembly can be operable to continuously metallize a plurality of parts within the part-coating conveyor system, a track connecting the in-line metallizer assembly with the one or more paint stations, and one or more pallets operable to advance along the track between the one or more paint stations and the in-line metallizer assembly.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein generally relate to in-line metallizer assemblies and part-coating conveyor systems incorporating in-line metallizer assemblies. In-line metallizer assemblies generally comprise an external rotating actuator exchange and a vacuum chamber integrated with a sputter coater. The external rotating actuator exchange may be operable to exchange one or more parts from an adjacent conveyor system with one or more parts from the vacuum chamber. The vacuum chamber may also comprise an internal rotating actuator exchange operable to transition one or more parts between the external rotating actuator exchange and the sputter coater. Thus, parts traveling along the conveyor system can be removed from the conveyor system, metallized (i.e., coated with a metal film), and returned to the conveyor system for further processing. The external rotating actuator exchange and internal rotating actuator exchange can act in cooperation to allow for the metallization of parts within the sputter coater while previously metallized parts are simultaneously exchanged with non-metallized parts outside of the vacuum chamber. Such cooperation may allow for the continuous in-line metallization of parts along a conveyor system. Part-coating conveyor systems may also incorporate an in-line metallizer assembly such that a base coat, metal coat and top coat can be independently applied to parts using a single conveyor system, such as an asynchronous conveyor system. Various embodiments of the in-line metallizer assemblies and part-coating conveyor systems will be described in more detail herein.

Figure 1:
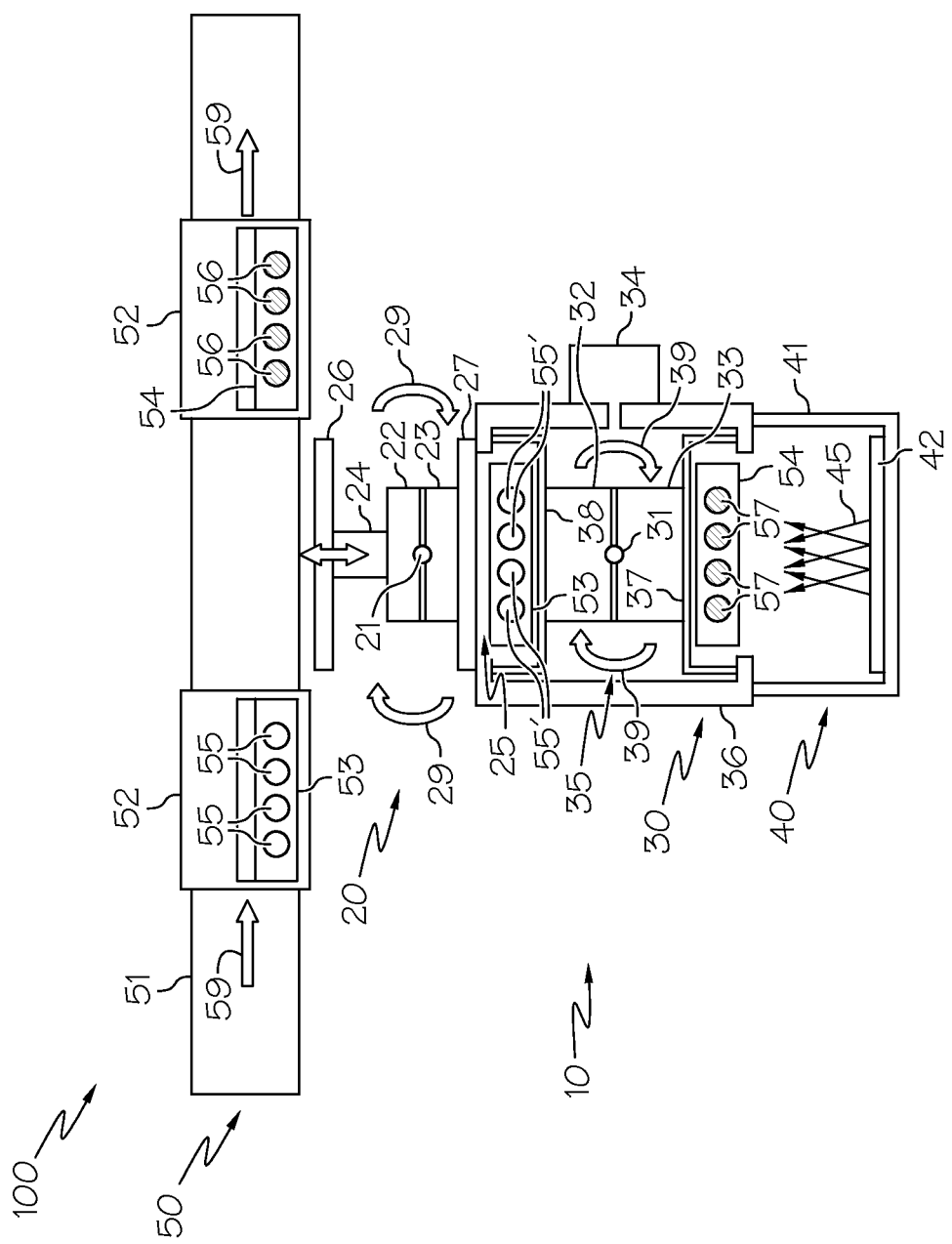
FIG. 1 depicts a schematic of an in-line metallizer assembly in cooperation with a conveyor system according to one or more embodiments shown and described herein.
Figure 2:
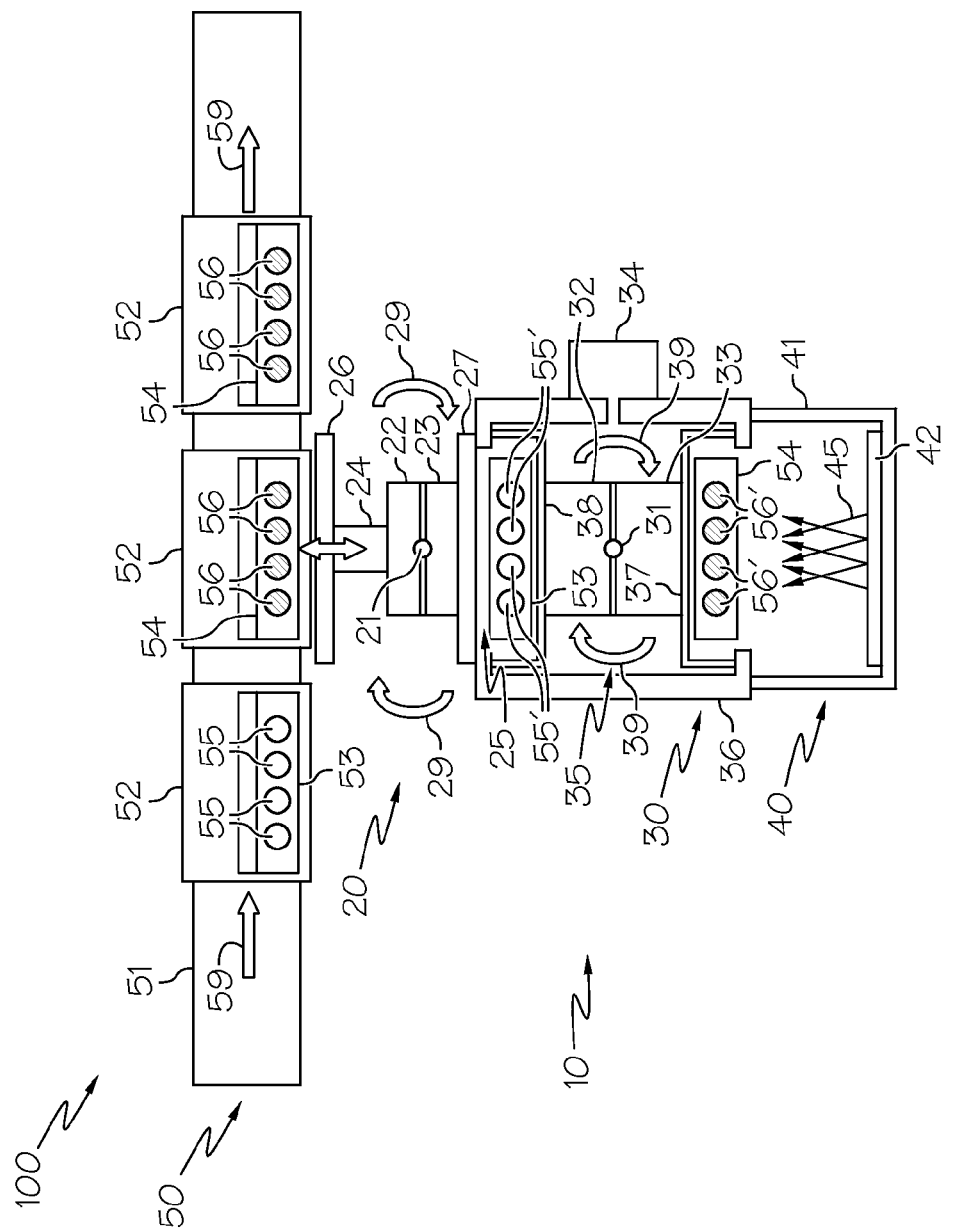
FIG. 2 depicts a schematic of an in-line metallizer assembly in cooperation with a conveyor system according to one or more embodiments shown and described herein.

Referring now to FIGS. 1 and 2, an exemplary in-line metallizer assembly 10 is depicted in cooperation with a conveyor system 50 as part of an exemplary part-coating conveyor system 100. As illustrated, and as will be discussed more fully herein, the conveyor system 50 transports parts adjacent the in-line metallizer assembly 10. Pre-metallized parts 55 are transported towards the in-line metallizer assembly 10 while metallized parts 56 are transported away from the in-line metallizer assembly 10. An external rotating actuator exchange 20 will extend and receive (i.e., pick-up) pre-metallized parts 55 from the conveyor system via its actuating arms 22,23 and external door clasp 26. The external rotating actuator exchange 20 will then retract and rotate to transport the pre-metallized parts 55 to a vacuum chamber 30. As seen in FIG. 2, this rotation may also allow for the external rotating actuator exchange 20 to simultaneously provide (i.e., drop-off) metallized parts 56 back to the conveyor system 50. Referring to FIG. 1, an internal rotating actuator exchange 35 disposed within the vacuum chamber 30 may then receive pre-metallized parts 55' when extended (as illustrated) within the vacuum chamber 30. The internal rotating actuator exchange 35 can also retract and rotate to transition pre-metallized parts 55' within the vacuum chamber 30 to a sputter coater 40. The sputter coater can then be activated such that parts 57 facing the metallizer 40 can undergo the metallizing process. As illustrated in FIG. 2, once the parts 56' facing the sputter coater 40 are fully metallized, the internal rotating actuator exchange 35 can retract and rotate to transition the metallized parts 56' back towards the external rotating actuator exchange 20. The internal rotating actuator exchange 35 can simultaneously transition new pre-metallized parts 55' within the vacuum chamber 30 to the sputter coater 40. The external rotating actuator exchange 20 may then receive and transition the metallized parts 56 back onto the conveyor system 50 to complete the metallizer cycle for a given group of parts.

The conveyor system 50 may comprise any conveyor system operable to facilitate the movement of objects (such as pallets 52, part carriers 53,54 and/or one or more parts 55,56 as will become further appreciated herein). For example, as depicted in FIGS. 1-4, the conveyor system 50 may comprise one or more conveyor belts 51 that are each operable to transport a plurality of objects simultaneously. In another embodiment, the conveyor system 50 may comprise a plurality of rollers that allow for objects to pass over the series of rollers with reduced friction. In yet another embodiment, the conveyor system 50 may comprise a guide path in which objects can drive along the guide path independent of one another. It should be appreciated that the conveyor system 50 may comprise any alternative system, or combinations thereof, such that it facilitates the movement of objects. In one specific embodiment, such as that depicted in FIGS. 1-3, the conveyor system 50 may comprise a plurality of pallets 52 operable to be transported along the conveyor belt 51. Each pallet 52 may be operable to hold a part carrier 53,54 which itself may be operable to hold one or more parts 55,56. As illustrated, part carriers carrying metallized parts 56 are identified as element 54. Part carriers carrying pre-metallized parts 55 are identified as element 53. Pallets 52 may comprise any structure operable to hold one or more part carriers 53,54 and/or one or more parts 55,56. For example, each pallet may comprise any type of tray, plate, bin, basket, container, or other type of receptacle.

One or more parts 55,56 may thereby be transported via each pallet 52 either directly or through a part carrier 53,54. Each pre-metallized part 55 may comprise any object that that can be metallized in a sputter coater 40 of the in-line metallizer assembly 10 as will become appreciated herein. For example, pre-metallized parts 55 may comprise plastic parts, glass parts or any other part in which a more metallic or reflective appearance is desired. In one specific embodiment, pre-metallized parts 55 may comprise injection molded plastic parts. Pre-metallized parts 55 may independently comprise any size, shape and configuration that allows for them to enter the vacuum chamber 30 of the in-line metallizer assembly 10. Part carriers 53,54 may comprise any apparatus operable to support one or more parts 55,56 throughout the metallizing process. For example, part carriers may comprise a plurality of vertical pins in which each individual part 55,56 may be supported by an individual pin. In another embodiment, part carriers 53,54 may alternatively or additionally comprise any other support structure such as support stands, seats, platforms or stages. In one specific embodiment, part carriers 53,54 may be operable to rotate each individual part 55,56. For example where a part 55,56 on a part carrier 53,54 passes by one or more fixed spray guns (such as those that apply paint or other coating to the part), the part carrier 53,54 may rotate the parts 55,56 such that paint may be applied to all areas of the parts 55,56 by a single gun. Such an embodiment may also allow for the metallizing of the entire part 55,56 when the part is placed in front of a sputter coater 40 as will become appreciated herein.

Still referring to FIGS. 1 and 2, the pallets 52 holding one or more part carriers 53,54 with one or more parts 55,56 can traverse along the conveyor belt 51 of the conveyor system 50 in a first conveyor direction 59. The first conveyor direction 59 may be any direction adjacent to the in-line metallizer assembly 10. More specifically, the first conveyor direction 59 may be any direction adjacent the in-line metallizer assembly that allows for an external rotating actuator exchange 20 to pick up part carriers 53,54 and/or individual parts 55,56 from the conveyor system 50. The first conveyor direction 59 may comprise a linear direction tangential to the in-line metallizer assembly 10 (such as that depicted in FIG. 1), may comprise an arced direction that passes around the in-line metallizer assembly 10, or may comprise any other direction or path that allows for the external rotating actuator exchange 20 to pick up part carriers 53,54 and/or individual parts 55,56. In one embodiment, the conveyor belt 51 may further be operable to traverse in a second conveyor direction opposite the first conveyor direction. Such an embodiment may allow pallets 52 to reverse along a conveyor system 50 to receive a metal coating.

The in-line metallizer assembly 10 may be disposed adjacent the conveyor system 50 and may generally comprise an external rotating actuator exchange 20, a vacuum chamber 30 with an internal rotating actuator exchange 35, and a sputter coater 40 integrated with the vacuum chamber 30. The external rotating actuator exchange 20 may comprise any apparatus operable to exchange one or more parts between the conveyor system 50 and the vacuum chamber 30. Specifically, the external rotating actuator exchange 20 may comprise an external rotating pivot 21 connected to a plurality of actuating arms 22,23,24. The rotating pivot may comprise any device operable to rotate the external rotating actuator exchange in an external rotating direction 29. The rotating direction 29 can comprise a clockwise direction, a counterclockwise direction or a combination of both (such as where the external rotating actuator exchange 20 first rotates in a clockwise direction before retracing its path in a counterclockwise direction). In one embodiment, the rotating pivot 21 may comprise a swivel or rod connected to a rotational drive source. The rotational drive source may be operable to turn the rotating pivot 21 to facilitate the rotation of the external rotating actuator exchange 20 in the external rotating direction 29. The rotational drive source may comprise any type of motor, engine, pneumatic apparatus and/or alternative source for power that is operable to rotate the external rotating actuator exchange 20 when the external rotating actuator exchange 20 is supporting one or more part carriers 53,54 and/or individual parts 55,56.

The plurality of actuating arms 22,23,24 connected to the rotating pivot 21 may each comprise any device operable to extend from and retract towards the rotating pivot 21. For example, as illustrated in FIGS. 1 and 2, in one embodiment, two or more actuating arms 22,24 may connect and extend from one side of the rotating pivot 21. In such an embodiment, the two or more actuating arms 22,24 may comprise a scissor-type cooperation wherein the two or more actuating arms 22,24 may extend and retract in length by collapsing and expanding in height respectively. In another embodiment, also as illustrated in FIGS. 1 and 2, a single actuating arm 23 may connect to the rotating pivot 21. In such an embodiment, the single actuating arm 23 may comprise an oscillating arm that may retract within itself, or may comprise a rigid arm that is driven away from and in towards the rotating pivot 21 via a ball screw. It should be appreciated that the actuating arms 22,23,24 may comprise any other alternative or additional configuration operable to extend from and retract towards the rotating pivot 21. The actuating arms 22,23,24 may be connected directly to the rotating pivot 21 or may be indirectly connected to the rotating pivot 21 through additional, arms, levers and/or other supports. Furthermore, similar to the rotating pivot 21, the extension and retraction of the actuating arms 22,23,24 may be powered by a lateral drive source operable to extend and retract the actuating arms 22,23,24 when the external rotating actuator exchange 20 is supporting one or more part carriers 53,54 and/or individual parts 55,56. The lateral drive force may further be operable to selectively extend or retract individual actuating arms 22,23,24. For example, where the actuating arm facing the vacuum 30 (actuator arm 23 in FIG. 1) is required to maintain its extension, the other actuating arms (actuating arms 22,23 in FIG. 1) may nonetheless be independently extended and retracted to pick up or drop of part carriers 53,54 and/or individual parts 55,56 from the conveyor system 50. In addition, the lateral drive source and the rotational drive source may comprise a single drive source, or may comprise a plurality of drive sources wherein each drive source can operate independent of the other.

Still referring to the external rotating actuator exchange 20 of the in-line metallizer assembly 10 illustrated in FIGS. 1 and 2, an external door clasp may be connected to each of the one or more actuating arms 22,23,24 distal the rotating pivot 21. For example, as seen in FIG. 1, a first external door clasp 26 and a second external door clasp 27 may be connected to the actuating arms 22,23,24 distal the rotating pivot 21. The first external door clasp 26 and second external door clasp 27 may comprise any device operable to both releasably engage one or more part carriers 53,54 (and/or individual parts 55,56) from the conveyor system 50 as well as provide a temporary vacuum seal around the entry port 25 of the vacuum chamber 30. As used herein "vacuum seal" refers to a seal that allows for an enclosed area to maintain a pressure lower than the pressure outside of the enclosed area. In one embodiment, the first external door clasp 26 and second external door clasp 27 may comprise a door with robotic grips operable to open and close about the one or more part carriers 53,54 and/or parts 55,56. In such an embodiment, the robotic grips may maintain sufficient pressure when closed to facilitate transportation of the one or more part carriers 53,54 and/or parts 55,56. In another embodiment, the first external door clasp 26 and second external door clasp 27 may comprise a flat plate (such as aluminum, iron or steel) with one or more pins or protrusions operable to engage receiving holes in the part carriers 53,54 and/or parts 55,56. In such an embodiment, the first external door clasp and second external door clasp may enter the receiving holes about the part carriers 53,54 and/or parts 55,56 when the actuating arms 22,23,24 are extended from the rotating pivot 21. Likewise, the first external door clasp and second external door clasp may exit the receiving holes about the part carriers 53,54 and/or parts 55,56 when the actuating arms 22,23,24 are retracted towards the rotating pivot 21. The first external door clasp 26 and the second external door clasp 27 may comprise the same type of device, or may each comprise a unique type of device.

As discussed above, the first external door clasp 26 and second external door clasp 27 can further be operable to provide a temporary vacuum seal around the entry port 25 of the vacuum chamber 30 to maintain vacuum pressure as will become more appreciated herein. Specifically, both the first external door clasp 26 and second external door clasp 27 may comprise sufficient size to encapsulate the entry port 25 of the vacuum chamber 30. In one embodiment, the first external door clasp 26 and second external door clasp 27 and/or the vacuum chamber walls may further comprise a periphery sealant to assist in providing a vacuum seal between the vacuum chamber 30 and one of the external door clasps 26,27. In one embodiment, the periphery sealant may comprise a rubber protrusion such as an o-ring. In such an embodiment, the vacuum chamber 30 and/or the first external door clasp 26 and second external door clasp 27 may comprise a receiving well to receive the o-ring, or the o-ring may be directly disposed between the flat surfaces of the vacuum chamber walls 36 and one of the external door clasps 26,27.

The vacuum chamber 30 of the in-line metallizer assembly 10 may be disposed adjacent the external rotating actuator exchange 10 and may comprise any enclosure operable to maintain vacuum pressure and house an internal rotating actuator exchange 35. As used herein "vacuum pressure" refers to any pressure internal an enclosure that is lower than the pressure external the enclosure. The vacuum chamber 30 can therefore, for example, comprise one or more vacuum pumps 34 connected to one or more vacuum chamber walls 36. The vacuum pump(s) 34 may be able to pump air out from the enclosure formed by the vacuum chamber walls 36 such that the enclosure possesses a vacuum pressure. The vacuum pressure may comprise any pressure less than that outside of the vacuum chamber 30 and sufficient to enable the metallizing of parts within the sputter coater 40. For example, in one embodiment the vacuum pump(s) 34 may be able to lower the pressure in the sputter coater 40 to a pressure from about 5 torr to about 10 torr (i.e., about 6.7 millibar to about 13.3 millibar) or to a pressure as low as about 0.008 torr (i.e., about 0.01 millibar).

The internal rotating actuator exchange 35 may comprise any apparatus operable to receive one or more parts from the external rotating actuator exchange 20, transition the one or more parts to the sputter coater 40 for metallizing, and transition the metallized one or more parts back to the external rotating actuator exchange 35. The internal rotating actuator exchange 35 may comprise an overall structure similar to the external rotating actuator exchange. Specifically, the internal rotating actuator exchange may comprise an internal rotating pivot 31 and internal actuating arms 32,32 connected (either directly or indirectly) to the internal rotating pivot 31. The internal rotating pivot 31 may comprise any device operable to rotate the internal rotating actuator exchange 35 in an internal rotating direction 39. The internal rotating direction 39 can comprise a clockwise direction, a counterclockwise direction or a combination of both (such as where the internal rotating actuator exchange 35 first rotates in a clockwise direction before retracing its path in a counterclockwise direction). In one embodiment, the internal rotating pivot 31 may comprise a swivel or rod connected to an internal rotational drive source. The internal rotational drive source may be operable to turn the internal rotating pivot 31 to facilitate the rotation of the internal rotating actuator exchange 35 in the internal rotating direction 39. The internal rotational drive source may comprise any type of motor, engine, pneumatic apparatus and/or alternative source for power that is operable to rotate the internal rotating actuator exchange 35 when the internal rotating actuator exchange 35 is supporting one or more part carriers 53,54 and/or parts 55,56 as received from the external rotating actuator exchange 20.

The internal actuating arms 32,33 connected to the internal rotating pivot 31 may each comprise any device operable to extend from and retract towards the internal rotating pivot 31. As discussed above with reference to the actuating arms 22,23,24 of the external rotating actuator exchange 20, single internal actuating arms 32,33 may connect to the internal rotating pivot 31 (as illustrated in FIG. 1) or multiple internal actuating arms may connect to the internal rotating pivot 31. The internal actuating arms 32,33 may be connected directly to the rotating pivot 31 or may be indirectly connected to the internal rotating pivot 31 through additional, arms, levers and/or other supports. Furthermore, similar to the internal rotating pivot 31, the extension and retraction of the internal actuating arms 32,33 may be powered by an internal lateral drive source operable to extend and retract the internal actuating arms 32,33 when the internal rotating actuator exchange 35 is supporting one or more part carriers 53,54 and/or parts 55,56 as received from the external rotating actuator exchange 20. The internal lateral drive source and the internal rotational drive source may comprise a single drive source, or may comprise a plurality of drive sources wherein each drive source can operate independent of one another. The internal lateral drive source may further be operable to provide enough force to the internal actuating arms to maintain vacuum pressure as will become further appreciated herein. Furthermore, the internal lateral drive force may also be operable to selectively extend or retract individual internal actuating arms 32,32 independent from one another.

Figure 3:
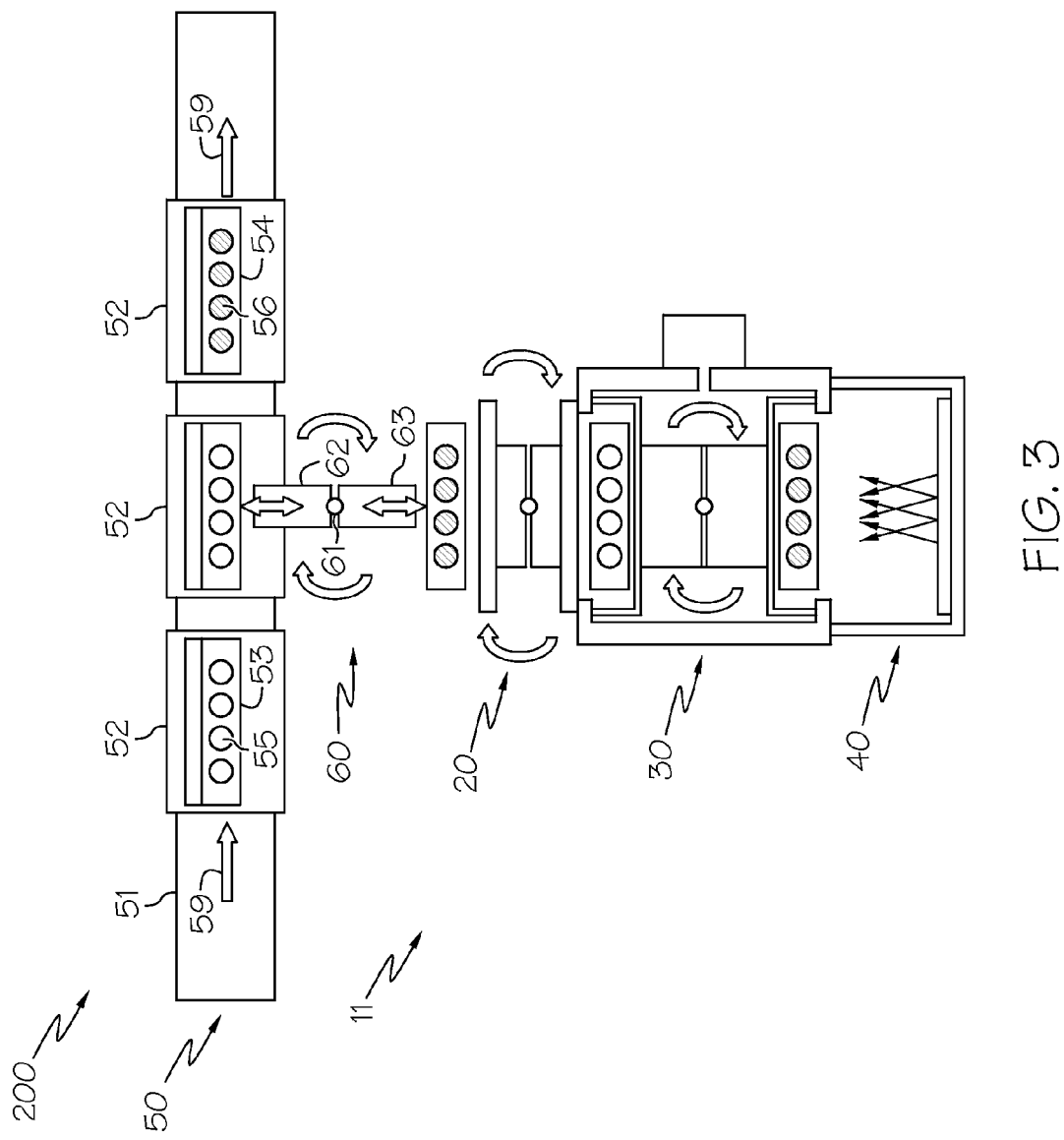
FIG. 3 depicts a schematic of another in-line metallizer assembly in cooperation with a conveyor system according to one or more embodiments shown and described herein.

Still referring to the internal rotating actuator exchange 35 in the vacuum chamber 30, an internal door clasp may be connected to each of the one or more internal actuating arms 32,33 distal the internal rotating pivot 31. For example, as illustrated in FIGS. 1-3, a first internal door clasp 37 and a second internal door clasp 38 may be connected to the internal actuating arms 32,33 distal the internal rotating pivot 31. The first internal door clasp 37 and second internal door clasp 38 may comprise any device operable to both hold one or more part carriers 53,54 (and/or individual parts 55,56) as received from the external rotating actuator exchange 20 as well as be sealed against the vacuum chamber 30 to maintain vacuum pressure within the vacuum chamber 30 and/or the sputter coater 40. For example, in one embodiment, the first internal door clasp 37 and second internal door clasp 38 may comprise box-like receptacles having one open side (i.e., the side that faces the entry port 25 or the sputter coater 40). In such an embodiment the part carriers 53,54 and/or parts 55,56 may be placed in the first internal door clasp by the external door clasps 26,27 of the external rotating actuator exchange 20. In another embodiment, the first internal door clasp 37 and second internal door clasp 38 may comprise one or more pins or protrusions operable to engage receiving holes in the part carriers 53,54 and/or parts 55,56. In such an embodiment, the first internal door clasp 37 and second internal door clasp 38 may enter the receiving holes about the part carriers 53,54 and/or parts 55,56 when the internal actuating arms 32,33 are extended from the internal rotating pivot 31. Likewise, the first internal door clasp 37 and second internal door clasp 38 may exit the receiving holes about the part carriers 53,54 and/or parts 55,56 when the internal actuating arms 32,33 are retracted towards the internal rotating pivot 31. In yet another embodiment, the external door clasps 26,27 may be operable to mate with the internal door clasps 37,38 such that actuation of an external door clasp 26,27 drives actuation of an internal door clasp 37,38 when mated. Such an embodiment may allow for controlled actuation of the internal door clasps 37,38 despite the vacuum pressure they experience. The first internal door clasp 37 and second internal door clasp 38 may comprise the same type of device, or may each comprise a unique type of device.

As discussed above, the first internal door clasp 37 and second internal door clasp 38 can further be operable to be sealed against the vacuum chamber 30 to maintain vacuum pressure within the vacuum chamber 30 and/or the sputter coater 40. Specifically, both the first internal door clasp 37 and second internal door clasp 38 may comprise sufficient size to encapsulate the entry port of the vacuum chamber 30. When an internal door clasp 37,38 is pushed against the vacuum chamber wall 36 about the entry port 25, the vacuum pressure within the vacuum chamber 30 will pull on the internal door clasp if an external door clasp 26,27 is not covering the exterior of the entry port 25. Thus, the force provided by the internal actuating arms and the internal lateral drive source must be sufficient to withstand the force from the external pressure such that the vacuum chamber 30 can maintain vacuum pressure. In one embodiment, the first internal door clasp 37 and second internal door clasp 38 may further comprise a periphery sealant to assist in providing a vacuum seal between the vacuum chamber 30 and one of the internal door clasps 37,38. In one embodiment, the periphery sealant may comprise a rubber protrusion such as an o-ring. In such an embodiment, the vacuum chamber 30 may comprise a receiving well that the o-ring fits into, or the o-ring may be disposed directly between the flat surfaces of the vacuum chamber 30 and one of the internal door clasps 37,38.

Still referring to FIGS. 1 and 2, a sputter coater 40 may further be integrated with the vacuum chamber 30. The sputter coater 40 may comprise any device operable for applying a metal coating to parts within the vacuum chamber 30. For example, as illustrated in FIGS. 1-3 the sputter coater 40 may comprise one or more cathodes 42 comprising the source material (and more specifically the metal) to be deposited onto the parts. When in operation, the sputtered metal 45 will form a film about the parts 56 such that the parts 56 are metallized and possess a more metallic or reflective finish. The sputtered metal can comprise any material operable to be sputtered onto the surface of the parts such as pure metals, alloys or other materials. The sputter coater can be completely disposed within the vacuum chamber 30, or, as illustrated in FIGS. 1-3, the sputter coater walls 41 of the sputter coater 40 may abut against the vacuum chamber walls 36 of the vacuum chamber 30 such that a vacuum pressure is present in the sputter coater 40 as maintained by the vacuum pump(s) 34. In one embodiment, the pressure in the sputter coater 40 may be greater than the pressure in the vacuum chamber 30 such that a pressure gradient exists between the two causing air to flow from the sputter coater 40 to the vacuum chamber 30. Such an embodiment may allow for any gas injected by (or otherwise present in) the sputter coater 40 to flow from the sputter coater 40 to the vacuum chamber 30. Such gases may comprise argon or other inert gases (for example, when the sputter coater 40 injects argon during the sputtering process), water vapor, air or any other injected or residual gas. In another embodiment, a plurality of sputter coaters 40 may be integrated with the vacuum chamber 30 such that a plurality of parts can be metallized in different sputter coaters 40 simultaneously, sequentially or in any other order or combination.

The in-line metallizer will now be explained through an exemplary method of operation. With reference to FIGS. 1 and 2, a plurality of parts (pre-metallized parts are identified as 55 and metallized parts are identified as 56) may be carried by part carriers (part carriers carrying pre-metallized parts 55 are identified as 53 and part carriers carrying metallized parts 56 are identified as 54). Each part carrier 53 is initially loaded onto its own pallet 52 and transported along the conveyor system 50 in the first conveyor direction 59. Once the pallet 52 reaches the in-line metallizer assembly 10, one or more actuating arms 22,24 of the external rotating actuator exchange 10 extend such that the part carrier 53 is received (e.g., picked up) from the pallet 52 by the first door clasp 26. Once the part carrier 53 is secured by the first external door clasp 26, the actuating arms 22,24 retract and the rotating pivot 21 rotates the external rotating actuator exchange 20 in the external rotating direction 29 such that the part carrier 53 held by the first door clasp 26 now faces the entry port 25 of the vacuum chamber 30.

Within the vacuum chamber 30, the first internal door clasp 38 is already against the vacuum chamber walls 36 so that the vacuum chamber does not experience an increase in pressure from the outside air. The actuating arms 22,24 supporting the first external door clasp 26 are extended so that the first external door clasp 26 is pushed against the vacuum chamber walls 36 and the part carrier 53 is passed off to the first internal door clasp 37 of the internal rotating actuator exchange 35. While the first external door clasp 26 remains against the vacuum chamber walls (to ensure vacuum pressure is maintained inside the vacuum chamber 30), the internal actuating arms 32,33 of the internal rotating actuator exchange 35 retract so that the first internal door clasp 37 (and second internal door clasp 38) can be rotated via the internal rotating pivot 31. Specifically, the first internal door clasp 37 is rotated such that the part carrier 53 is now facing the sputter coater 40, and part carrier 54 carrying just metallized parts 56 faces the first external door clasp 26 of the external rotating actuator exchange 20. The internal actuating arms 32,34 are then extended so that the part carrier 53 with pre-metallized parts 55 is pushed towards the sputter coater 40 for metallizing. Likewise, second internal door clasp 38 now holding the part carrier 54 with metallized parts 56 is pushed against the vacuum chamber walls 36 around the entry port 25 such that it faces the first external door clasp 26 of the external rotating actuator exchange 20. While the parts 57 are being metallized via the sputter coater 40, the second internal door clasp 38 remains against the vacuum chamber walls 36 while the first external door clasp 26 (of the external rotating actuator exchange 20) receives the part carrier 54 from the second internal door clasp 38, retracts its actuating arms 22,23,24 with the part carrier 54, rotates via its rotating pivot 21, extends its actuating arms 22,23,24 and provides the now metallized parts 56 on the part carrier 54 to a waiting pallet 52.

By possessing at least two actuating arms, each with its own external door clasp, the external rotating actuator exchange 20 can simultaneously receive one or more parts from the internal rotating actuator exchange 35 and receive one or more parts from the conveyor system 50 (i.e. from a pallet 52). Likewise, the external rotating actuator exchange 20 can also simultaneously provide one or more parts to the internal rotating actuator exchange 35 and provide one or more parts to the conveyor system 50 (i.e., to a pallet 52).

Referring now to FIG. 3, an alternative in-line metallizer assembly 11 is illustrated. Similar to FIG. 1, the in-line metallizer assembly 11 of FIG. 2 generally comprises an external rotating actuator exchange 20, a vacuum chamber 30 and a sputter coater 40. However, the in-line metallizer assembly 11 further comprises an additional transfer exchange 60 for transferring the pallets 52, part carriers 53,54 and/or parts 55,56 from the conveyor system 50 to the external rotating actuator exchange 20. More specifically, the transfer exchange 60 may comprise a transfer rotating pivot 61 and or one or more transfer actuating arms 62,63. The transfer exchange 60 may thereby be configured to transport pallets 52, part carriers 53,54 and/or parts 55,56 between the conveyor and the external rotating actuator exchange. In one embodiment, the transfer exchange 60 operates in a similar manner as the external rotating actuator exchange (wherein the transfer actuating arms 62,63 would repeatedly be retracted, rotated and extended). In another embodiment, the transfer exchange 60 may simply transport individual pallets 52, part carriers 53,54 and/or parts 55,56 in a linear manner between the conveyor and the external rotating actuator exchange 20. It should be appreciated that the transfer exchange 60 may alternatively or additionally embody any other transfer mechanism and may thereby provide additional flexibility in the location of the remaining elements of the in-line metallizer assembly 11 with respect to the conveyor system 50.

Figure 4:
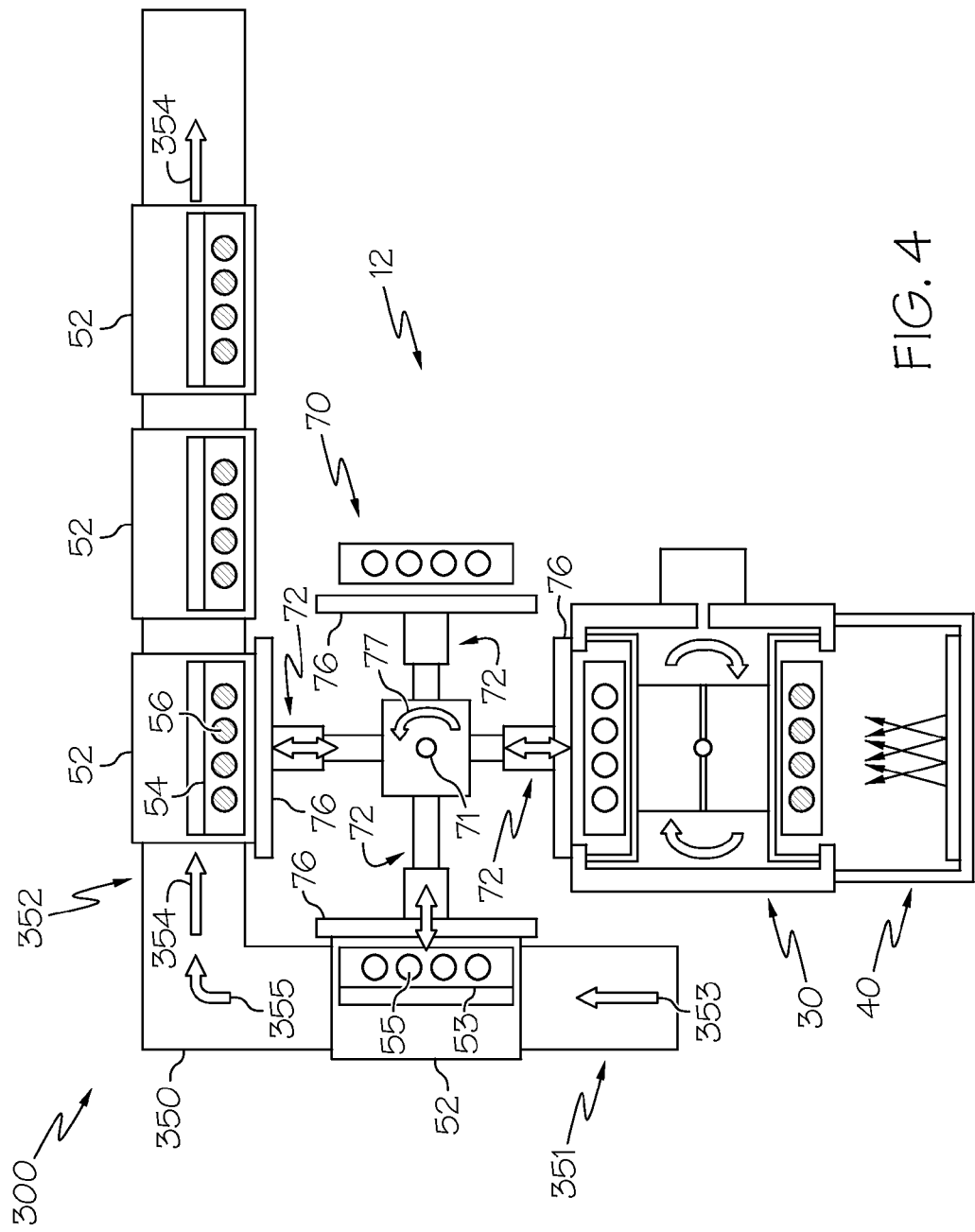
FIG. 4 depicts a schematic of yet another in-line metallizer assembly in cooperation with a conveyor system according to one or more embodiments shown and described herein.

Referring now to FIG. 4, yet another in-line metallizer assembly 12 is illustrated. Similar to FIG. 1, the in-line metallizer assembly of FIG. 3 comprises a vacuum chamber 30 with an integrated sputter coater 40 adjacent a conveyor 350. However, the in-line metallizer assembly 12 further comprises an external rotating actuator multi-exchange 70 for transferring multiple part carriers 53,54 and/or parts 55,56 between the conveyor 350 and the vacuum chamber 30. In such an embodiment, the conveyor 350 may be used to transfer part carriers 53,54 and/or parts 55,56 as described above. However, the conveyor belt(s) 351,352 of the conveyor 350 may travel in both a first conveyor direction 353 and a second conveyor direction 354 merged by a conveyor transition 355 (such as a bend, corner or other mechanism for changing the direction of pallets 52, part carriers 53,54 and/or parts 55,56). Both the first conveyor direction 353 and the second conveyor direction 354 may pass adjacent the external rotating actuator multi-exchange 70.

The external rotating actuator multi-exchange 70 may comprise an external rotating pivot 71 and a plurality of external actuating arms 72 each having an external door clasp 76 attached thereto. The external rotating actuator multi-exchange 70 may be operable to rotate in a rotating direction 77 to transition between receiving pre-metallized parts 55 from the conveyor 350 and providing metallized parts 56 back onto the conveyor 350. The external rotating actuator multi-exchange 70 may specifically be operable to simultaneously receive a new part carrier 53 from the conveyor 350, receive or provide a part carrier 53,54 to or from the vacuum chamber 30, and provide part carriers 54 to the conveyor 350. Such an embodiment may accommodate faster cycle times by the sputter coater 40 by simultaneously picking up and dropping off part carriers 53,54 on the conveyor 350 as opposed to sequentially providing (i.e., dropping into the pallet 52) part carriers 54 and then receiving new part carriers 53.

Figure 6:
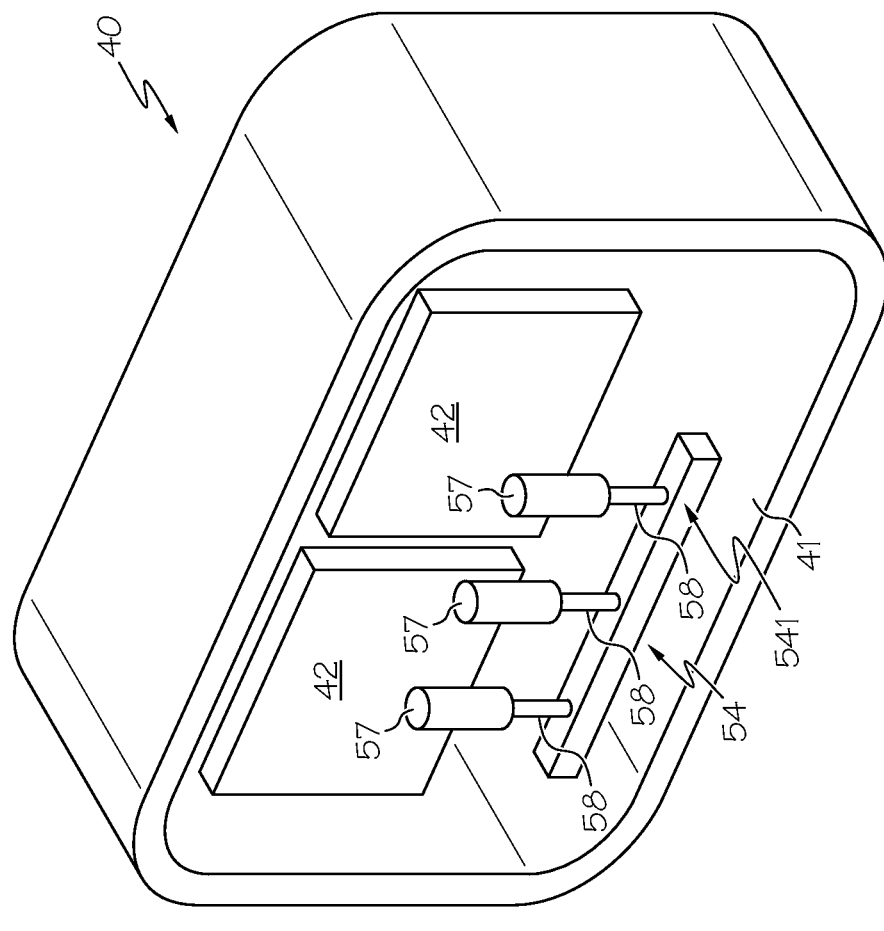
FIG. 6 schematically depicts a portion of a in-line metallizer assembly according to one or more embodiments shown and described herein.

Referring now to FIG. 6, a portion of the in-line metallizer assembly 10 is depicted. In this embodiment, the sputter coater 40 of the in-line metallizer assembly 10 is depicted with certain components, including the vacuum chamber 30 and the internal rotating pivot 31 (depicted, for example, in FIGS. 1-4) removed for clarity. As depicted in FIG. 6, the part carriers 54 include a plurality of rotatable pin fixtures 58 that extend from a flight bar 541. Individual parts 57 are positioned on the plurality of rotatable pin fixtures 58 of the part carriers 54, which support the individual parts 57 as the parts are transitioned into and out of the vacuum chamber 30, and during the metallization process. While the depicted embodiment includes three rotatable pin fixtures 58 coupled to the flight bar 541, it should be understood that the part carriers 54 may include any number of rotatable pin fixtures 58 based on the particular size and arrangement of the in-line metallizer assembly 10, the individual parts 57, and the requirements of the metallization process. As described hereinabove, the part carriers 54 are introduced to the sputter coater 40 as to position the individual parts 57 proximate to the cathodes 42 to complete the metallization process on the individual parts 57.

With the individual parts 57 positioned proximate to the cathodes 42, the rotatable pin fixtures 58 rotate with respect to the flight bar 541, and therefore rotate the individual parts 57 relative to the flight bar 541 and the cathodes 42 of the in-line metallizer assembly 10. Rotation of the individual parts 57 allows for the cathodes 42 to complete the metallization process to the surfaces of the individual parts 57 as the individual parts 57 are rotated proximate to the cathodes 42. Further, by introducing the individual parts 57 to the vacuum chamber 30 when supported by the rotatable pin fixtures 58, the in-line metallizer assembly 10 may be able to accommodate individual parts having a variety of shapes and configurations through the use of substitute part carriers, while maintaining the configuration of the internal rotating pivot and the external rotating pivot.

The surface treatment station 550 may comprise any station to prepare or treat the surface of a part before, between or after undergoing coating and/or metallizing applications. For example, in one embodiment, the surface treatment station 550 may comprise a blow off station operable to blow off unwanted debris, excess paint, or any other material that may inadvertently be present. In another embodiment, the surface treatment station 550 may additional or alternatively comprise a mechanical brush or plasma applier. The basecoat station 600 and topcoat station 700 may comprise any stations operable to apply a basecoat and a topcoat of paint to a plurality of parts. As described above, the basecoat station 600 and topcoat station 700 can comprise one or more spray guns that are either fixed or moveable. The one or more spray guns may thereby apply paint to the surface of the parts as the parts travel through the basecoat station 600 and/or the topcoat station 700. The basecoat station 600 and the topcoat station 700 may comprise distinct stations, or, in the alternative, may comprise a single station operable to apply a basecoat and a topcoat independent of the other. The flash oven station 800 may comprise any station operable to help remove solvent from a recently applied paint (e.g., the basecoat or the topcoat). In one embodiment, the flash oven station 800 may comprise an infrared oven. In another embodiment, the flash oven station 800 may comprise a convective oven. It should be appreciated that the flash oven station 800 may comprise any other type of oven either alternatively or additionally such that it is operable to remove solvent from parts. Finally, the cure station 900 may comprise any station operable to cure paint recently applied to a part (e.g., the basecoat or the topcoat). The cure station 900 may comprise any combination of length and temperature to enable the curing of UV paints. In one embodiment, the cure station may comprise a UV cure station where UV light is applied to assist in the curing of the paint. It should further be appreciated that any other types of cure stations may be employed, either alternatively or additionally, to help cure the paint applied to a part.

In one embodiment, the part-coating system 1000 can further comprise a part molder operable to create the original parts. The part molder can comprise any machine operable to produce plastic parts, such as, for example, an injection molding machine. In such an embodiment, the part molder may be integrated with the track 500 such that parts produced from the part molder can directly travel along the track 500 to the basecoat station 600, the metallizer assembly 10, the topcoat station and/or any process station. Such an embodiment may allow for parts to forgo receiving basecoats by reducing the waiting time before being metallized or receiving a topcoat (and thereby reducing the chances the surface of the parts are scratched or otherwise damaged).

Figure 5:
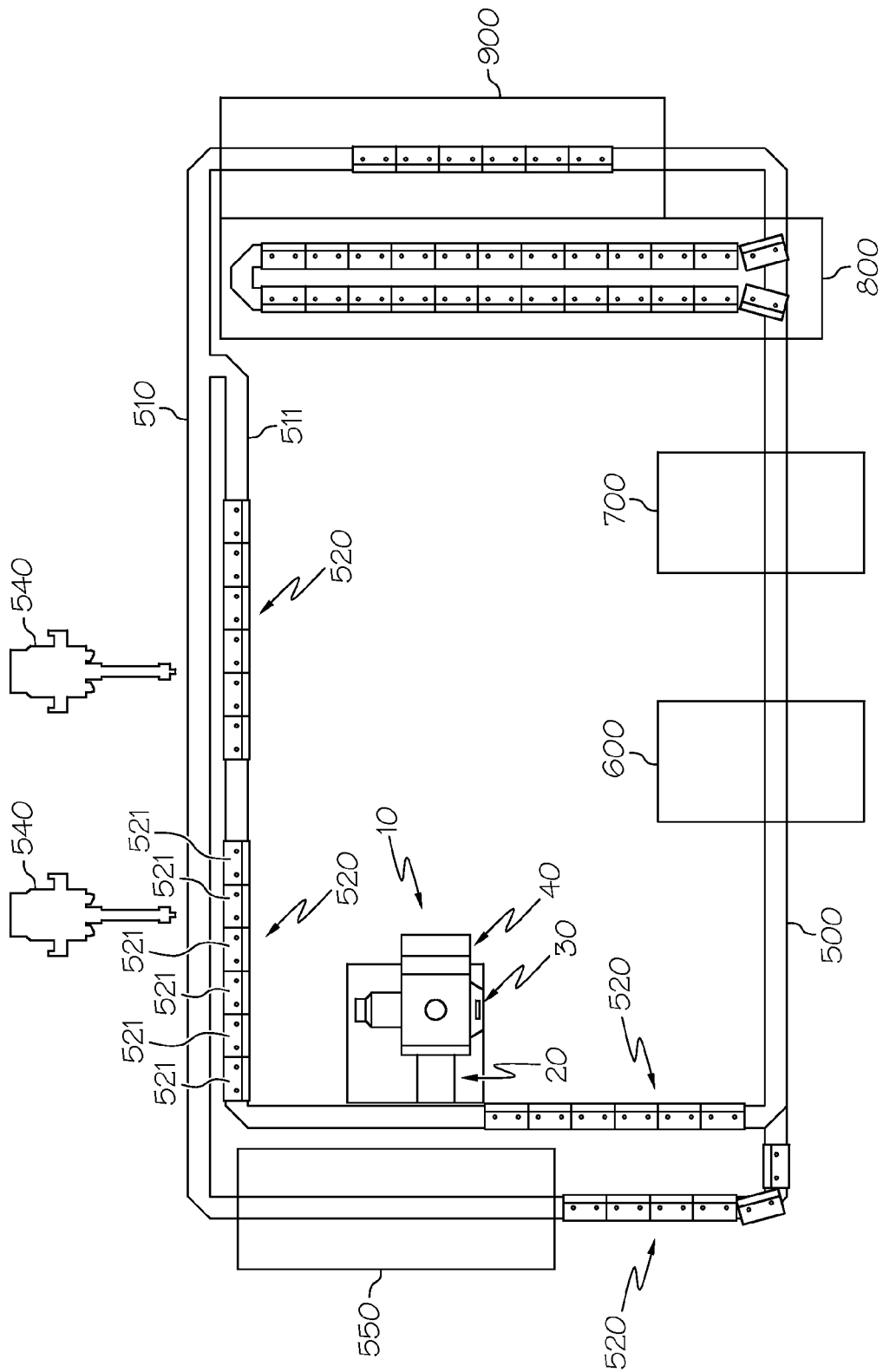
FIG. 5 depicts a schematic of a part-coating conveyor system with an in-line metallizer assembly.

Still referring to FIG. 5, the track 500 can further comprise pallets 521 staged in asynchronous groups. Asynchronous groups 520 can comprise a single pallet 521 (such that each group is just a single pallet 521), a set number of pallets 521 (such that each asynchronous group 520 comprises the same set number of pallets 521), or any independent number of pallets 521 (such that each asynchronous group 520 can comprise any number of pallets 521 independent from one another). Asynchronous groups are groups that can travel along the track 500 independent of one another. For example, as opposed to a "chain-on-edge conveyor" (i.e., a conveyor in which all parts are transported by a continuous chain such that each part starts and stops in synch), asynchronous pallets on the track 500 can start and stop independent of one another. In such an embodiment, the movement and direction of each asynchronous group 520 of pallets 521 can be achieved through the use of RFID tags, scanners, flags, electrical signals, machine logic part mapping or any other alternative method for tracking the status of parts to direct them to subsequent stations.

In operation, one or more parts are loaded into pallets 521 on the track 500 via one or more loaders 540. The one or more loaders 540 can comprise any combination of manual or automatic loaders operable to load and unload parts, part carriers and/or pallets onto the track 500. The pallets 521 are arranged in asynchronous groups 520 where each pallet 521 in the asynchronous group 520 holds parts that are at a common stage (such as no paint, base coat only, base coat and metallized coat or all coats). An asynchronous group 520 of pallets 521 with newly molded parts (i.e., no paint coatings) may first be directed to the surface treatment station 550 to blow off unwanted debris left over from initial manufacturing, or otherwise be treated to improve adhesion such as through the use of flames, corona or other type of plasma. The asynchronous group 520 of pallets 521 is then directed through the basecoat station 600 where an initial base coat (e.g., a primer coat) is applied. The base coat can help fill in surface defects left over from manufacturing as well as provide durability and color. After the asynchronous group 520 of pallets 521 passes through the basecoat station 600, it is directed to the flash oven station 800 and/or cure station 900 so that the basecoat can set. It should be noted that where the basecoat station 600 and topcoat station 700 are two separate stations in the same track line (as illustrated in FIG. 5), the asynchronous group 520 of pallets 521 could pass through the topcoat station without actually stopping to receive the topcoat application. Depending on the desired treatment, the asynchronous group 520 of pallets 521 can return to the basecoat station 600 to receive additional basecoats such that the parts are coated with a plurality of basecoats (such as a primer coat and a first coat of base paint). In the alternative, asynchronous group 520 of pallets 521 may independently bypass the basecoat station 600 such as where parts are freshly manufactured and have not acquired surface abrasions, scratches or other defects.

After completion and setting of the basecoat, the asynchronous group 520 of pallets 521 would then be directed to the in-line metallizer assembly 10. The external rotating actuator exchange 20 of the in-line metallizer assembly 10 may thereby continuously pickup the parts from the pallets 521 (either individually or via part carriers) for metallizing while also returning the metallized parts to pallets 521. The in-line metallizer assembly 10 can thereby alleviate the need to collect and remove large batches of parts to be metallized when employing a batch metallizer. Once the parts of the asynchronous group 520 of pallets 521 are all metallized, the asynchronous group 520 of pallets 521 is directed to the topcoat station 700 (potentially via passing through the basecoat station 600 without actually receiving a basecoat). After receiving a topcoat from the topcoat station 700, the asynchronous group 520 of pallets 521 is directed to the flash oven station 800 and cure station 900. Finally, the completed products in the asynchronous group 520 of pallets 521 may be removed from the track 500 by the manual or automatic loaders 540.

Where a particular machine or part breaks down thereby stopping part of the part-coating conveyor system 1000, asynchronous groups 520 of pallets 521 with partially completed parts may continue on where operable. For example, if the basecoat station 600 breaks down, new asynchronous groups 520 of pallets 521 cannot receive a basecoat of paint. However, asynchronous groups 520 of pallets 521 that have already passed through the basecoat station 600 can nonetheless continue through the application cycle since the entire track 500 is not stopped. Unlike chain-on-edge configurations, the asynchronous groups 520 help ensure parts that have received one or more coats of paint can be finalized without excessive downtime, which in turn can decrease the number of parts lost to quality control.

It should now be appreciated that in-line metallizer assemblies may continuously metallize parts off of a conveyor belt without the need for batch loading/unloading. In-line metallizer can continuously pick up parts from a conveyor belt and swap them with recently metallized parts. The newly picked-up parts may be transferred to a vacuum chamber where they can be metallized and returned. While parts are being metallized inside the vacuum chamber, a new set of pre-metallized parts is picked up and exchanged with the most recently metallized parts. This in-line metallizer assembly may further be combined with an asynchronous part-coating conveyor system to efficiently apply a basecoat, metallized coat and topcoat to a part. The asynchronous grouping of pallets can help ensure partially completed pallets receive their next coats before an undesirable amount of time passes.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An in-line metallizer assembly comprising:
   a plurality of part carriers each adapted to hold a plurality of parts, the part carriers comprising a flight bar and a plurality of rotatable fixture pins extending from the flight bar, wherein the rotatable fixture pins are adapted to rotate with respect to the flight bar;
   a vacuum chamber comprising an entry port that passes through a vacuum chamber wall;
   an external rotating actuator exchange operable to exchange one or more part carriers between a conveyor system and the vacuum chamber, the external rotating actuator comprising:
      one or more actuator arms adapted to rotate about an external rotating pivot and adapted to extend and retract towards the external rotating pivot, the external rotating pivot being positioned outside of the vacuum chamber; and
      one or more external door clasps that are coupled to the actuator arms and that selectively seal around the entry port of the vacuum chamber, the one or more external door clasps comprising one of a robotic grip operable to open and close about the one or more part carriers or one or more pins or protrusions operable to engage a receiving hole in one of the one or more part carriers on the conveyer system; and
   an internal rotating actuator exchange that is positioned within the vacuum chamber, the internal rotating actuator exchange comprising:
      one or more internal actuator arms adapted to rotate about an internal rotating pivot and adapted to extend and retract towards the internal rotating pivot, the internal rotating actuator exchange being operable to receive the one or more part carriers from the external rotating actuator exchange, transition the one or more part carriers to a sputter coater integrated with the vacuum chamber for metallizing of the plurality of parts held thereon, and return the part carriers holding the metallized plurality of parts to the external rotating actuator exchange such that the external rotating actuator exchange returns the part carriers holding the metallized plurality of parts to the conveyor system; and
      one or more internal door clasp that are coupled to the internal actuator arms and which selectively seal around the entry port of the vacuum chamber.

2. The in-line metallizer assembly of claim 1 wherein the external rotating actuator exchange is operable to simultaneously receive a part carrier from the internal rotating actuator exchange and receive a part carrier from the conveyor system.

3. The in-line metallizer assembly of claim 1 wherein the external rotating actuator exchange is operable to simultaneously provide a part carrier to the internal rotating actuator exchange and return a part carrier to the conveyor system.

4. The in-line metallizer assembly of claim 1 wherein the vacuum chamber maintains a vacuum pressure.

5. An in-line metallizer assembly comprising:
a plurality of part carriers each adapted to hold a plurality of parts, the part carriers comprising a flight bar and a plurality of rotatable fixture pins extending from the flight bar, wherein the rotatable fixture pins are adapted to rotate with respect to the flight bar;
a vacuum chamber comprising an entry port that passes through a vacuum chamber wall;
an integrated sputter coater positioned inside of the vacuum chamber;
an external rotating actuator exchange comprising:
one or more actuating arms connected to a rotating pivot that are positioned outside of the vacuum chamber, the one or more actuating arms being operable to extend from and retract towards the rotating pivot, and the rotating pivot being operable to rotate the external rotating actuator exchange; and
one or more external door clasps that are coupled to the actuator arms and that selectively seal around the entry port of the vacuum chamber, the one or more external door clasps comprising one of a robotic grip operable to open and close about one of the plurality of part carriers or one or more pins or protrusions operable to engage a receiving hole in one of the plurality of part carriers on the conveyer system; and
an internal rotating actuator exchange positioned inside of the vacuum chamber comprising:
one or more internal actuating arms connected to an internal rotating pivot, the one or more internal actuating arms being operable to extend from and retract towards the internal rotating pivot, and the internal rotating pivot being operable to rotate the internal rotating actuator exchange; and
one or more internal door clasp that are coupled to the internal actuator arms and which selectively seal around the entry port of the vacuum chamber.

6. The in-line metallizer assembly of claim 5 wherein the external door clasp is further operable to provide a vacuum seal with the vacuum chamber when the internal rotating actuator exchange is rotating.

7. The in-line metallizer assembly of claim 5 wherein an internal door clasp is connected to each of the one or more internal actuating arms distal the internal rotating pivot.

8. The in-line metallizer assembly of claim 7 wherein the internal door clasp is further operable to provide a vacuum seal with the vacuum chamber when the external rotating actuator exchange is rotating.

9. The in-line metallizer assembly of claim 1, wherein one of the external door clasp or the internal door clasp seals around the entry port of the vacuum chamber while the opposite of the internal door clasp that is coupled to the internal actuator arm or the external door clasp that is coupled to the external actuator arm is free to pivot about the respective internal rotating pivot or the external rotating pivot.

10. The in-line metallizer assembly of claim 1, wherein the at least one external door clasp and the at least one internal door clasp are larger than the entry port of the vacuum chamber such that the at least one external door clasp and the at least one internal door clasp encapsulate the entry port of the vacuum chamber.

11. The in-line metallizer assembly of claim 1, wherein the external door clasp and the internal door clasp both selectively seal to the vacuum chamber wall to maintain a vacuum pressure in the vacuum chamber and between the external door clasp and the internal door clasp and across the entry port of the vacuum chamber.

12. The in-line metallizer assembly of claim 1, wherein at least one of the external door clasp and the vacuum chamber wall and at least one of the internal door clasp and the vacuum chamber wall comprise a periphery sealant that selectively seals between the external door clasp and the vacuum chamber and the internal door clasp and the vacuum chamber, respectively.

13. The in-line metallizer assembly of claim 12, wherein the periphery sealant comprises a receiving well that extends into at least two of the external door clasp, the internal door clasp, and the vacuum chamber wall, and o-rings that are positioned within the receiving wells.

14. The in-line metallizer assembly of claim 1, wherein:
the internal rotating actuator exchange further comprises a lateral drive source that selectively applies a lateral drive force to extend and retract the internal actuator arms, and
the lateral drive force provided by the lateral drive source is sufficient to maintain sealing between the internal door clasp and the vacuum chamber wall when the vacuum chamber is maintained at a vacuum pressure.

* * * * *